(12) United States Patent
Kim et al.

(10) Patent No.: US 7,855,895 B2
(45) Date of Patent: Dec. 21, 2010

(54) UNIVERSAL PCB AND SMART CARD USING THE SAME

(75) Inventors: Dong-Han Kim, Osan-si (KR); Young-Hoon Ro, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/607,288

(22) Filed: Oct. 28, 2009

(65) Prior Publication Data
US 2010/0038438 A1  Feb. 18, 2010

Related U.S. Application Data

(62) Division of application No. 11/457,734, filed on Jul. 14, 2006, now Pat. No. 7,630,209.

(30) Foreign Application Priority Data

Jul. 14, 2005   (KR) ...................... 10-2005-0063755

(51) Int. Cl.
*H05K 7/10* (2006.01)

(52) U.S. Cl. ...................... 361/767; 361/760; 361/768; 361/777; 361/808; 174/260; 174/261

(58) Field of Classification Search ................ 361/736, 361/737, 760, 768, 777, 808, 767, 748, 784, 361/803; 174/260, 261, 254; 257/678, 679, 257/692, 780, 441, 486, 380; 343/700 MS, 343/866, 873; 438/106, 108; 235/441, 486, 235/380
See application file for complete search history.

(56) References Cited

U.S. PATENT DOCUMENTS

| | | | |
|---|---|---|---|
| 5,598,032 A | 1/1997 | Fidalgo | |
| 6,103,548 A * | 8/2000 | Miks et al. | 438/106 |
| 6,370,029 B1 | 4/2002 | Kawan | |
| 6,424,027 B1 | 7/2002 | Lamson et al. | |
| 6,558,976 B2 | 5/2003 | Shrauger | |
| 6,568,600 B1 | 5/2003 | Carpier et al. | |
| 6,817,534 B2 | 11/2004 | Gray | |
| 6,914,196 B2 * | 7/2005 | Cho | 174/254 |
| 2002/0053735 A1 * | 5/2002 | Neuhaus et al. | 257/728 |
| 2003/0024996 A1 | 2/2003 | Muehlberger et al. | |
| 2004/0256150 A1 | 12/2004 | Barchmann et al. | |
| 2005/0093124 A1 | 5/2005 | Kajimoto et al. | |
| 2006/0139901 A1 | 6/2006 | Meireles et al. | |
| 2006/0185895 A1 * | 8/2006 | Kalidas | 174/261 |
| 2008/0197479 A1 | 8/2008 | Kim et al. | |

FOREIGN PATENT DOCUMENTS

| | | |
|---|---|---|
| JP | 2005-018402 | 1/2005 |
| KR | 10-2002-0011361 | 2/2002 |

* cited by examiner

*Primary Examiner*—Dameon E Levi
*Assistant Examiner*—Hoa C Nguyen
(74) *Attorney, Agent, or Firm*—Volentine & Whitt, PLLC

(57) ABSTRACT

A smart card is provided including a body with a cavity, an IC chip inserted into the cavity, and a universal PCB on which the IC chip can be mounted and electrically contacted regardless of its size, type and bonding structure. The universal PCB comprises groups of contact pads suitable for contacting IC chips of different sizes and designs.

14 Claims, 16 Drawing Sheets

US 7,855,895 B2

UNIVERSAL PCB AND SMART CARD USING THE SAME

CROSS-REFERENCE TO RELATED APPLICATIONS

This application is a divisional of application Ser. No. 11/457,734, which was filed on 14 Jul. 2006, issued as U.S. Pat. No. 7,630,209 on Dec. 8, 2009, and claims priority from Korean Patent Application No. 10-2005-0063755, which was filed on 14 Jul. 2005. The disclosure of Korean Patent Application No. 10-2005-0063755 is incorporated by reference in its entirety.

BACKGROUND

1. Technical Field

The disclosure relates to a smart card, and more particularly, to a universal printed circuit board (PCB) that can be used suitably for the various positions of chip pads, regardless of the size, type and bonding structure of an integrated circuit (IC) chip, and a smart card using the universal PCB.

2. Description of the Related Art

Smart cards or IC cards are used as microprocessor-carrying units. The smart card preferably means a card into which an IC is inserted. The smart card includes an IC processor, a small-capacity memory, and an interface card.

A smart card module inserted into most smart cards includes a PCB on which an IC chip is mounted. The IC chip is mounted on one side of the PCB, and the other side of the PCB is equipped with ISO 7816-2 external contact pads. The external contact pads include a total of 8 pads defined in the ISO 7816-2 standard.

In general, the IC chip is first mounted on the PCB of the smart card module according to a chip-on-board (COB) package technique, and then the smart card module is inserted into the cavity of the body of the smart card.

The number of connection pads for connecting the IC chip to the PCB is varied according to the type, size and/or bonding structure (or electrical assembly structure) of the IC chip. The relative position of the connection pads with respect to the PCB may also be varied according to the structure of the IC chip. Accordingly, a given IC chip design requires a dedicated PCB that is designed for pad positions specific to the type, size and/or bonding structure of the IC chip.

However, as the use of smart cards is extended into various fields, various IC chip designs are used for incorporation into the smart cards. Further, the method of mounting the IC chip on the PCB is also varied. Accordingly, it becomes difficult and expensive to design and manufacture the dedicated PCBs. These effects tend to prevent the mass production of the smart cards.

In order to reduce the manufacturing cost for the smart card product, a mass production method capable of reducing the unit cost of a component of the smart card product is required. However, when the dedicated PCBs suitable for the respective IC chips or the mounting structures thereof are used, it is difficult to manufacture the smart card products through the mass production method.

Consequently, a universal PCB that can be used suitably for various chip pad positions regardless of the size, type and bonding structure of the IC chip, and/or the number of the chip pads is required.

SUMMARY

Embodiments of the invention provide a smart card with a cavity into which an IC chip mounted on a universal PCB is inserted. The universal PCB is provided in such a way that the IC chip can be mounted to the PCB regardless of the size, type or bonding structure of the IC chip.

BRIEF DESCRIPTION OF THE DRAWINGS

The above and other features and advantages of the invention will become more apparent by describing in detail exemplary embodiments thereof with reference to the attached drawings.

DETAILED DESCRIPTION

Figure 1A:
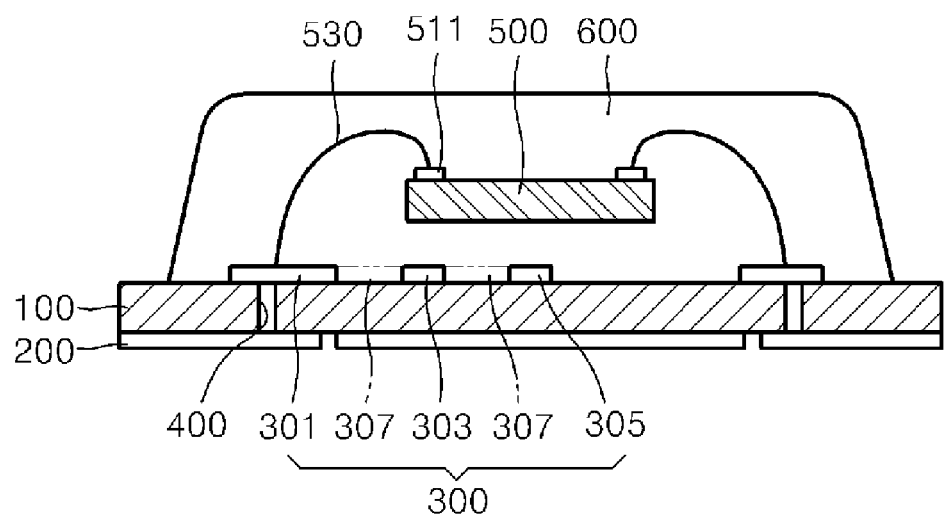
FIG. 1A is a sectional view of a smart card module in which an IC chip is mounted on a universal PCB by wire bonding according to an embodiment of the invention.

The invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure is thorough and complete, and fully conveys the inventive principles found in embodiments of the invention to those skilled in the art.

When an IC chip is bonded to a PCB, the relative positions of chip pads with respect to the PCB are varied according to the type, size, bonding structure, and/or the number of chip pads on the IC chip. The invention provides a smart card including a universal PCB having a plurality of connection pads corresponding to various positions of chip pads, on which a chip can be mounted regardless of its type, size, bonding structure and the number of its chip pads. The invention provides a universal PCB having internal connection pads that are formed on one surface of the PCB at positions corresponding to the chip pads which can be electrically connected to the chip pads.

Each of the internal connection pads may be electrically connected to one of the chip pads and the internal connection pads are provided in arrangements suitable for handling variation in the relative positions of the chip pads. Accordingly, a specific chip pad can be electrically connected or wire-bonded to one of the internal connection pads, regardless of a change in the relative positions of the chip pads.

The internal connection pads are disposed at different positions on the PCB to be electrically connected to the corresponding chip pads. Further, several internal connection pads form an internal connection pad group with each internal connection pad within the internal connection pad group suitable for electrical connection to a chip pad. Accordingly, it can be understood that internal connection pad groups are also disposed on the PCB.

The internal connection pad groups are disposed on one surface of the PCB. External contact pads are disposed on the opposite surface of the PCB, and the external contact pad and any one of the internal connection pads are electrically connected by a connection via penetrating the PCB. An external circuit pattern includes the external contact pads, and the disposition of the pads may be determined according to the ISO 7816-2 standard.

The external circuit pattern may be designed to include a total of eight independent external contact pads according to the ISO 7816-2 standard. The eight independent external contact pads may include a pad for Vcc power supply, a pad for a reset signal RST, a pad for a clock signal CLK, an RFU (reserved for future use) pad under the ISO/IEC 7816 standard, a pad for Vpp (programming voltage) power supply, a data I/O pad, and other RFU pads.

A group of internal connection pads are electrically connected to each of the external contact pads by a connection via. Each internal connection pad of a group of internal connection pads is electrically connected to the other internal connection pads in the group by an internal connection line. Also, a group of internal connection pads are electrically isolated from another group of internal connection pads. The internal circuit pattern including these internal connection pads groups is disposed on the opposite surface of the PCB with respect to the external circuit pattern.

The smart card is electrically connected to the external contact pads to communicate data with the external circuit. For wireless data communication by radio frequencies, an antenna may be introduced into the internal circuit pattern or the card body.

When the antenna is introduced into the internal circuit pattern, an antenna pattern may be introduced surrounding a region in which the internal connection pads and the connection lines are disposed. When an external antenna is introduced into the card body, an external antenna pad for electrical connection to the external antenna may be introduced onto the surface of the PCB upon which the internal connection pads and the connection lines are disposed.

Preferably, the external antenna pad is exposed to the outside when the IC chip is mounted on the PCB and is then encapsulated by an encapsulation material. When a smart card module formed by mounting the IC chip on the PCB is inserted into a cavity of the card body, the external antenna pad contacts with the external antenna exposed inside the cavity.

The disposition of the chip pads in the IC chip can be classified into two types; an edge-pad type where the chip pads are disposed at an edge portion of the IC chip and a center-pad type where the chip pads are disposed at a center portion of the IC chip.

In the universal PCB according to the invention, the internal connection pad group may include an internal connection pad for the edge pad and an internal connection pad for the center pad, which are electrically connected to each other. Accordingly, the universal PCB can be used for both the edge-pad type IC chip and the center-pad type IC chip.

Either a wire bonding method or a flip-chip bonding method may be used to mount and electrically connect the IC chip on the PCB. When comparing the wire bonding method with the flip-chip bonding method, the IC chip is bonded in an upside-down manner. Therefore, the position of a specific chip pad is reversed left and right in the two bonding methods.

In the universal PCB according to the invention, a wire-bonding internal connection pad and a flip-chip bonding internal connection pad are disposed at the left and right of the PCB, respectively, and are electrically connected to each other. Accordingly, the universal PCB can be used selectively for both the wire bonding method and the flip-chip-bonding method with respect to the same IC chip.

When the smart card uses an antenna, at least five chip pads may be electrically connected to the respective internal connection pad groups. For example, two pads connected to the antenna, an RST pad, a CLK pad, and a Vcc pad may be electrically connected to the respective internal connection pad groups. In this case, since the internal circuit pattern has both an internal antenna pattern and an external antenna pad connected to an external antenna, the external antenna or the internal antenna pattern may be used as an antenna.

Since the internal connection pad group of the internal circuit pattern includes the connection pads disposed corresponding to the chip pads, the universal PCB can be used regardless of the size, type and bonding structure of the IC chip.

Figure 1B:
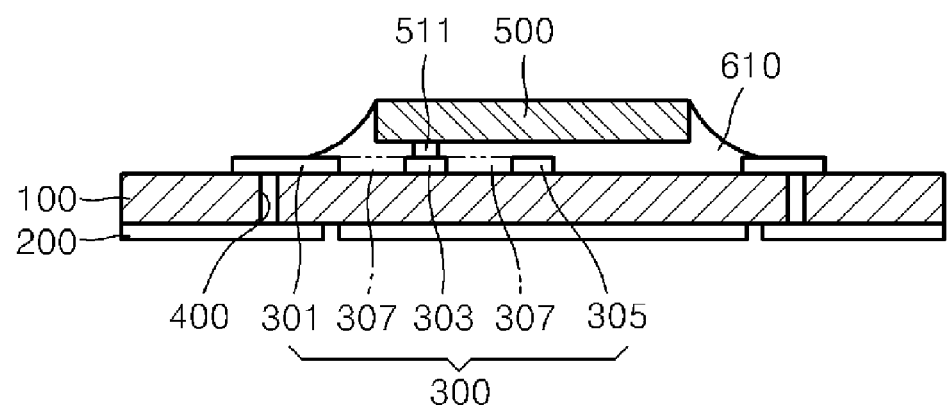
FIG. 1B is a sectional view of a smart card module in which an edge pad type IC chip is mounted on a universal PCB by flip-chip bonding according to an embodiment of the invention.
Figure 1C:
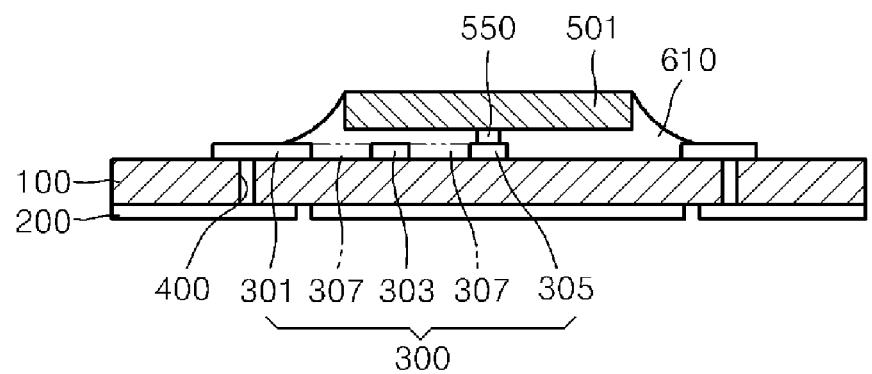
FIG. 1C is a sectional view of a smart card module in which a center pad type IC chip is mounted on a universal PCB by flip-chip bonding according to an embodiment of the invention.
Figure 2A:
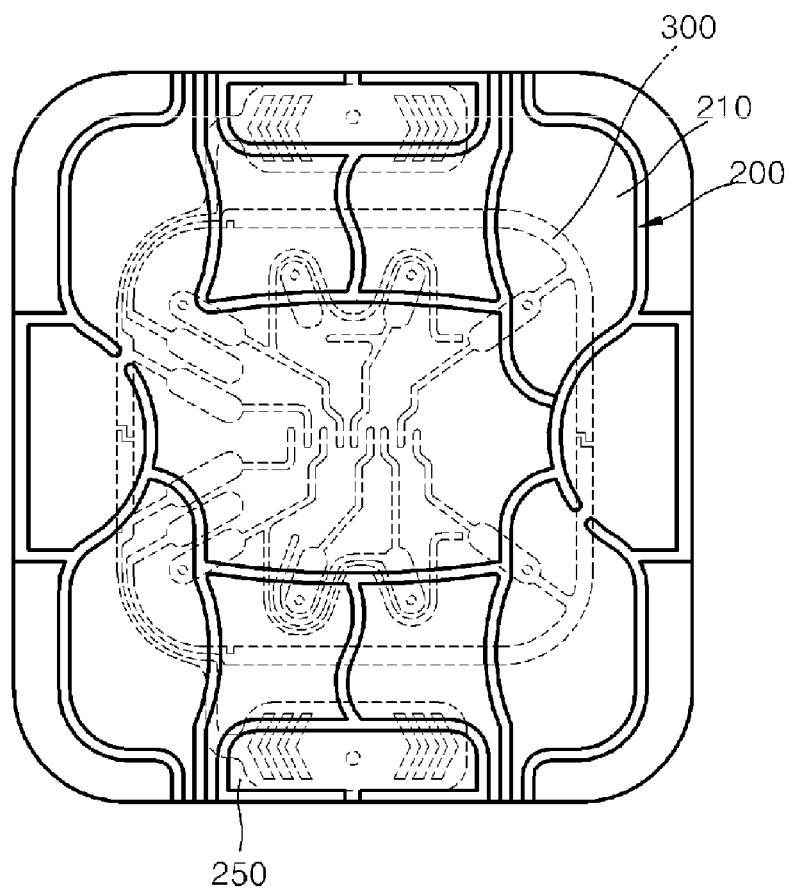
FIGS. 2A through 2C are plan views illustrating circuit patterns designed on a universal PCB according to an embodiment of the invention.
Figure 2B:
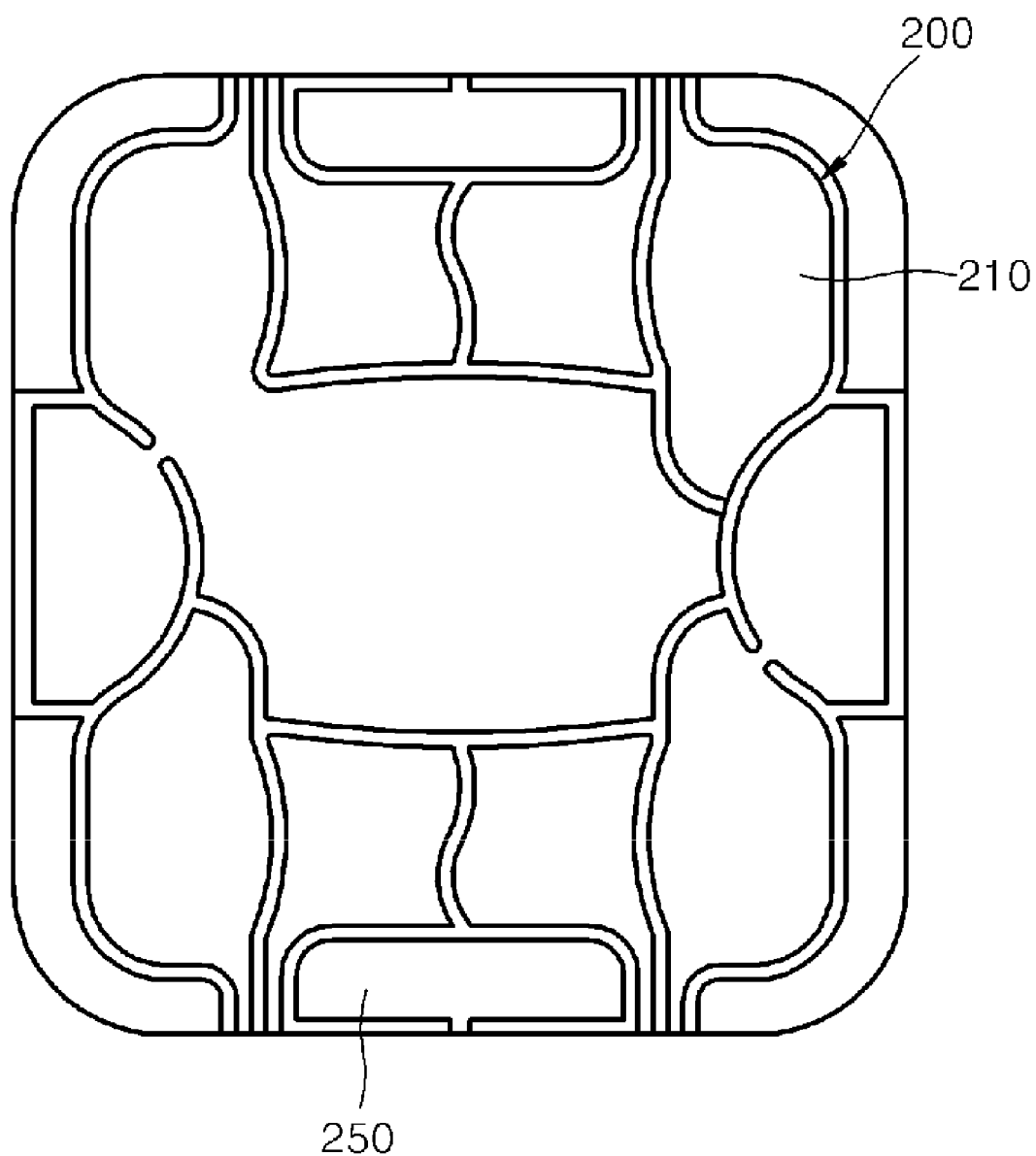
Figure 2C:
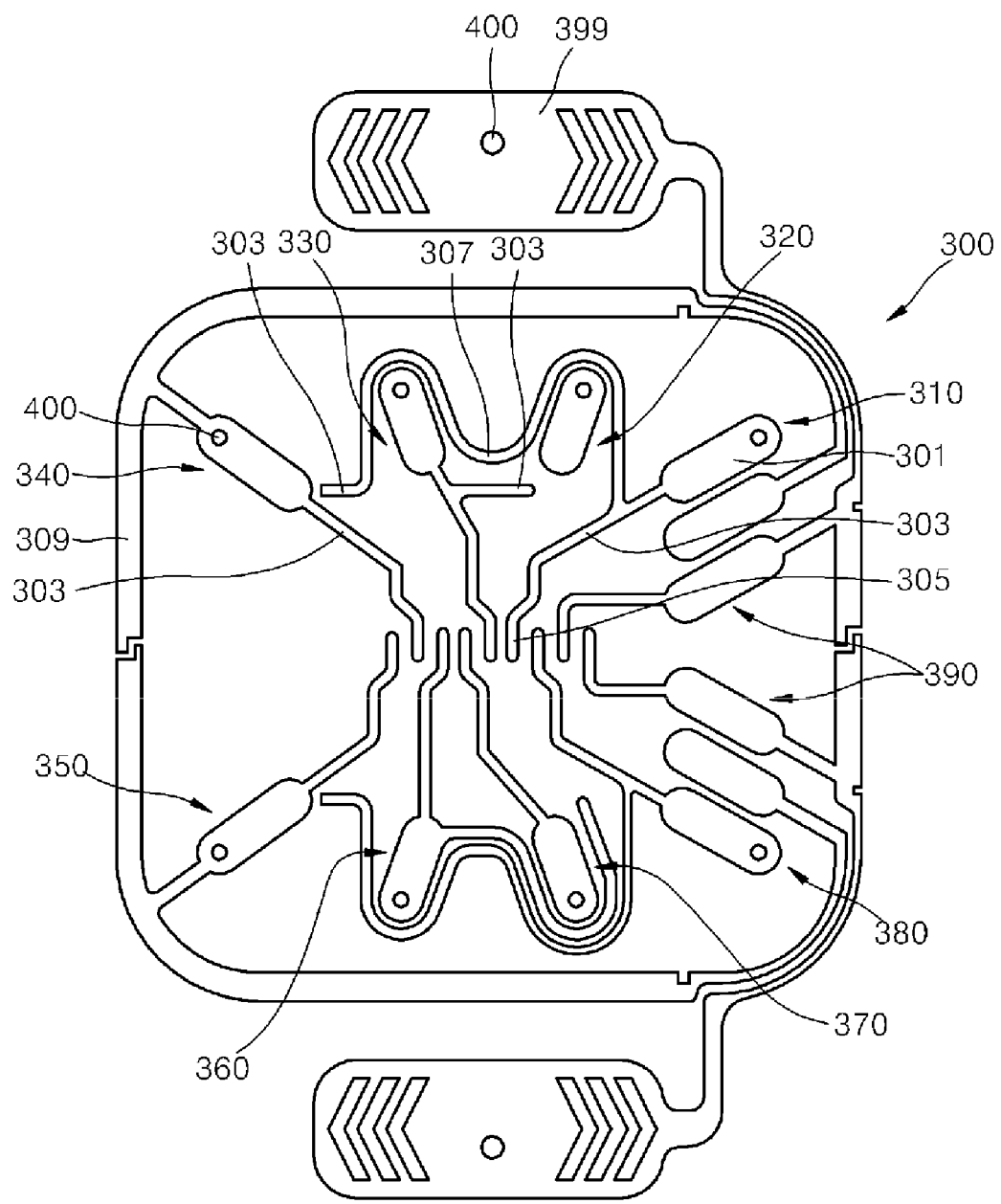
Figure 3A:
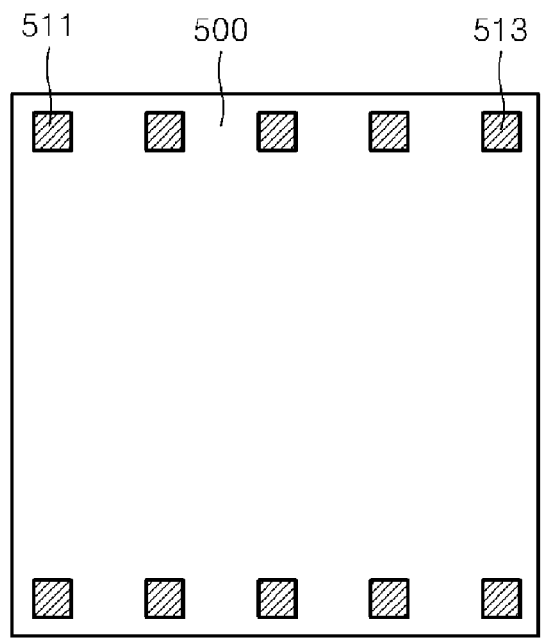
FIGS. 3A and 3B are plan views illustrating the positions of connection pads for connecting an IC chip to a universal PCB according to an embodiment of the invention.
Figure 3B:
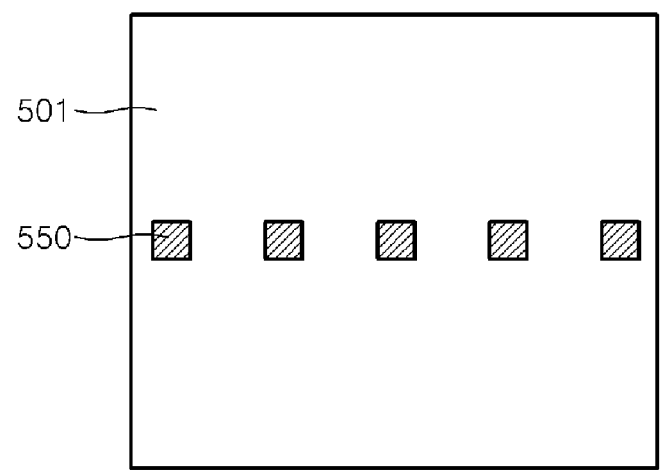

FIGS. 1A through 1C are sectional views of a smart card module in which an IC chip is mounted on a universal PCB according to an embodiment of the invention. FIGS. 2A through 2C are plan views illustrating circuit patterns designed on a universal PCB according to an embodiment of the invention. FIGS. 3A and 3B are plan views illustrating the positions of connection pads for connecting an IC chip to a universal PCB according to an embodiment of the invention.

Referring to FIGS. 1A through 1C, a smart card according to an embodiment of the invention may include a smart card module installed in its body. The smart card module may include a PCB 100, and an edge-pad type IC chip 500 or a center-pad type IC chip 501 mounted on the PCB 100.

The edge-pad type IC chip 500 may be mounted on the PCB 100 by wire bonding as illustrated in FIG. 1A, or the edge-pad type IC chip 500 may be mounted on the PCB 100 by flip-chip bonding as illustrated in FIG. 1B. The edge-pad type IC chip 500 may have chip pads 511 and 513 arranged at its edge portion as illustrated in FIG. 3A.

Also, the center-pad type IC chip 501 may be mounted on the PCB 100 by flip-chip bonding as illustrated in FIG. 1C. The center-pad type IC chip 501 may have chip pads 550 arranged at its center portion as illustrated in FIG. 3B. The center-pad type IC chip 501 is advantageous in that it can be smaller than the edge-pad type IC chip 500.

Referring to FIGS. 2A through 2C, the PCB 100 has an external circuit [pattern 200 formed on one surface and an internal circuit 300 formed on the opposite surface. The circuit patterns 200 and 300 are designed such that they can be used regardless of the types and bonding structures of the IC chips 500 and 501. The circuit patterns 200 and 300 may include a conductive layer (e.g., a copper layer), and the conductive layer may be plated with nickel and/or gold.

As illustrated in FIG. 2B, the external circuit pattern 200 may be designed to include external contact pads 210 and external antenna contact pads 250 for the external contact of an antenna pattern. The external contact pads 210 may be disposed according to the ISO 7816-2 standard, and the external antenna contact pads 250 may be disposed outside the external contact pads 210.

As illustrated in FIG. 2C, the internal circuit pattern 300 may include internal connection pads 301, 303 and 305 that are electrically connected to the IC chip 500 or 501. Also, the internal circuit pattern 300 may include an internal connection line 307 for connecting the internal connection pads 301, 303 and 305 on a group basis, and a pair of external antenna pads 399 that are intended to contact with the external antenna. Preferably, the external antenna pads 399 are disposed outside a region in which the internal connection pads 301, 303 and 305 are disposed, so that they are contact-connected to the external antenna when the PCB is inserted into the body of the smart card.

Also, the internal circuit pattern 300 may include a pair of internal antenna patterns 309 that are formed to surround the region in which the internal connection pads 301, 303 and 305 are disposed. The PCB 100 can be utilized in applications where an external antenna is used and in applications where the internal antenna patterns 309 are used as an antenna.

The external circuit pattern 200 and the internal circuit pattern 300 are electrically connected by connection vias 400 that penetrate the PCB 100. The internal connection pads 301, 303 and 305 of each internal connection pad group are electrically connected by the internal connection line 307. Accordingly, when the internal connection pad 301 and the external contact pad 210 are connected by the connection via 400, the internal connection pads 303 and 305 are thereby also electrically connected to the corresponding external contact pad 210.

Since the external antenna pad 399 can be connected to the external contact pad 250 by the connection via 400, separate connection vias may not be provided to the internal connection pads 301, 303 and 305 in the internal connection pad group for the external antenna pad that is provided to electrically connect the external antenna pad 399 and the chip pads 511, 513 and 550.

So that the PCB 100 can be universally used to mount the IC chip 500 or the IC chip 501, which are of different types, the PCB 100 includes the internal connection pads 301, 303 and 305 that are located corresponding to the chip pads 511, 513 and 550 whose positions are varied according to the types and bonding structures of the IC chips 500 and 501.

It can be understood that a plurality of the internal connection pads 301, 303 and 305 disposed at different positions on the PCB 100 are electrically connected into one group by the internal line 307 to constitute a circuit pattern.

For example, as illustrated in FIGS. 2A and 2C, the internal circuit pattern 300 includes groups of the internal connection pads 301, 303 and 305. As illustrated in FIGS. 1A through 1C, each of the internal connection pad groups may include the first, second and third internal connection pads 301, 303 and 305 corresponding to the chip pads 511, 513 and 550, which have substantially the same function but have different relative positions with respect to the PCB 100, and the internal connection line 307 connecting the pads 301, 303 and 305.

The number of the internal connection pad groups may be determined according to the number of the external contact pads 210. When an external antenna is used, the internal circuit pattern 300 may include another pair of internal connection pad groups intended to be connected to the external antenna.

The internal connection pad groups are electrically isolated from one another, and at least one pad group is disposed at a position substantially corresponding to the external contact pad 210. For example, four upper groups 310, 320, 330 and 340 and four lower groups 350, 360, 370 and 380 may be disposed at vertically-symmetrical positions.

The internal connection pad groups 390 for connecting an external antenna may be disposed in a pair at vertically-symmetrical positions at the left or right side of the PCB 100.

The internal connection pads 301, 303 and 305 are disposed at different positions in the upper group 310. For example, when the edge-pad type IC chip 500 is wire-bonded to the PCB 100, the first internal connection pad 301 is disposed near the corresponding chip pad 511. Accordingly, it can be understood that the first internal connection pad 301 acts as a wire-bonding pad. The second internal connection pad 303 acts as a pad electrically connected to the chip pad 511 (FIG. 1B) performing the same function. When the IC chip 500 is flip-chip-bonded on the PCB 100 in an upside-down manner as illustrated in FIG. 1B, the second internal connection pad 303 is disposed at a contact position with respect to the chip pad 511. Accordingly, the second internal connection pad 303 acts as a flip-chip-bonding pad. Since the flip-chip bonding requires a smaller pad area than the wire bonding, the second internal connection pad 303 may be designed to have a smaller line width than the first internal connection pad 301.

When the bonding structure is changed from the wire bonding to the flip-chip bonding, the relative position of the chip pad 511 with respect to the PCB 100 is changed from side to side. Accordingly, the first internal connection pad 301 and the second internal connection pad 303 are disposed at horizontally-opposite sides. Since the contact positions are different in the wire bonding structure and the flip-chip bonding structure, the second internal connection pad 303 is designed to be disposed more inward than the first internal connection pad 301 toward the center of the internal circuit pattern 300. A bonding wire 530 may have a more outward contact position in the wire bonding structure than in the flip-chip bonding structure, as illustrated in FIGS. 1A and 1B.

The third internal connection pad 305 acts as a pad electrically connected to the chip pad 550 (FIG. 1C) performing the same function. In the case of the center-pad type IC chip 501 having the center chip pads 550 as illustrated in FIG. 1C, the third internal connection pad 305 acts as a pad for bonding the IC chip 501 to the center chip pad 550. Since the center-pad type IC chip 501 can also be flip-chip-bonded on the PCB 100, the third internal connection pad 305 can be designed to have a smaller line width than the first internal connection pad 301 as illustrated in FIG. 2C.

Since the center chip pads 550 are located at a substantially center portion of the IC chip 501, the third internal connection pad 305 is disposed in a line with the third internal connection pads 305 of the other groups.

The first, second and third internal connection pads 301, 303 and 305 are electrically connected to the internal connection line 307. In order for the internal connection pad groups to be electrically isolated from one another, the internal connection line 307 may have a branched-structure as in the third group 330, a straight-line structure as in the seventh group 370, a structure without a branch line as in the second group 320, or a structure surrounding the periphery of the first internal connection pads 301 of the other groups as in the first group 310.

As a result, the IC chips 500 and 501 can be mounted on the PCB 100, regardless of their types, sizes and bonding structures.

As illustrated in FIG. 1A, the chip pad 511 of the IC chip 500 may be wire-bonded to the first internal connection pad 301. The first internal connection pad 301 may be connected through the connection via 400 to the external circuit pattern 200 including the external contact pad. In this wire bonding structure, an encapsulation material 600 may be molded to protect the bonding wire 530. The encapsulation member 600 may be molded to expose the external antenna pad 399 (FIG. 2C).

As illustrated in FIG. 1B, the chip pad 511 or a bump of the IC chip 500 may be flip-chip-bonded to the second internal connection pad 303. The second internal connection pad 303 may be connected to the first internal connection pad 301 and the internal connection line 307, and then be connected through the connection via 400 to the external circuit pattern 200. In this flip-chip bonding structure, an encapsulation material 610 may be injected between the IC chip 500 and the PCB 100 to protect the flip-chip-bonded portion. The encapsulation material 610 may be injected so as to expose the external antenna pad 399 (FIG. 2C).

As illustrated in FIG. 1C, the chip pad 550 or a bump of the center-pad type IC chip 501 may be flip-chip-bonded to the third internal connection pad 305. The third internal connection pad 305 may be connected to the first internal connection pad 301 and the internal connection line 307, and then be connected through the connection via 400 to the external circuit pattern 200. In this flip-chip bonding structure, an encapsulation material 610 may be injected between the IC chip 501 and the PCB 100 to protect the flip-chip-bonded portion. The encapsulation material 610 may be injected so as to expose the external antenna pad 399 (FIG. 2C).

The PCB 100 may include the internal antenna pattern 309 (FIG. 2C) for data communication and the external antenna pads 399 to be connected to the external antenna. Accordingly, the internal circuit pattern 300 may include the internal connection pad groups for connecting the external antenna pads 399 and/or the internal antenna pattern 309 to the chip pads 511 or 550.

Figure 4:
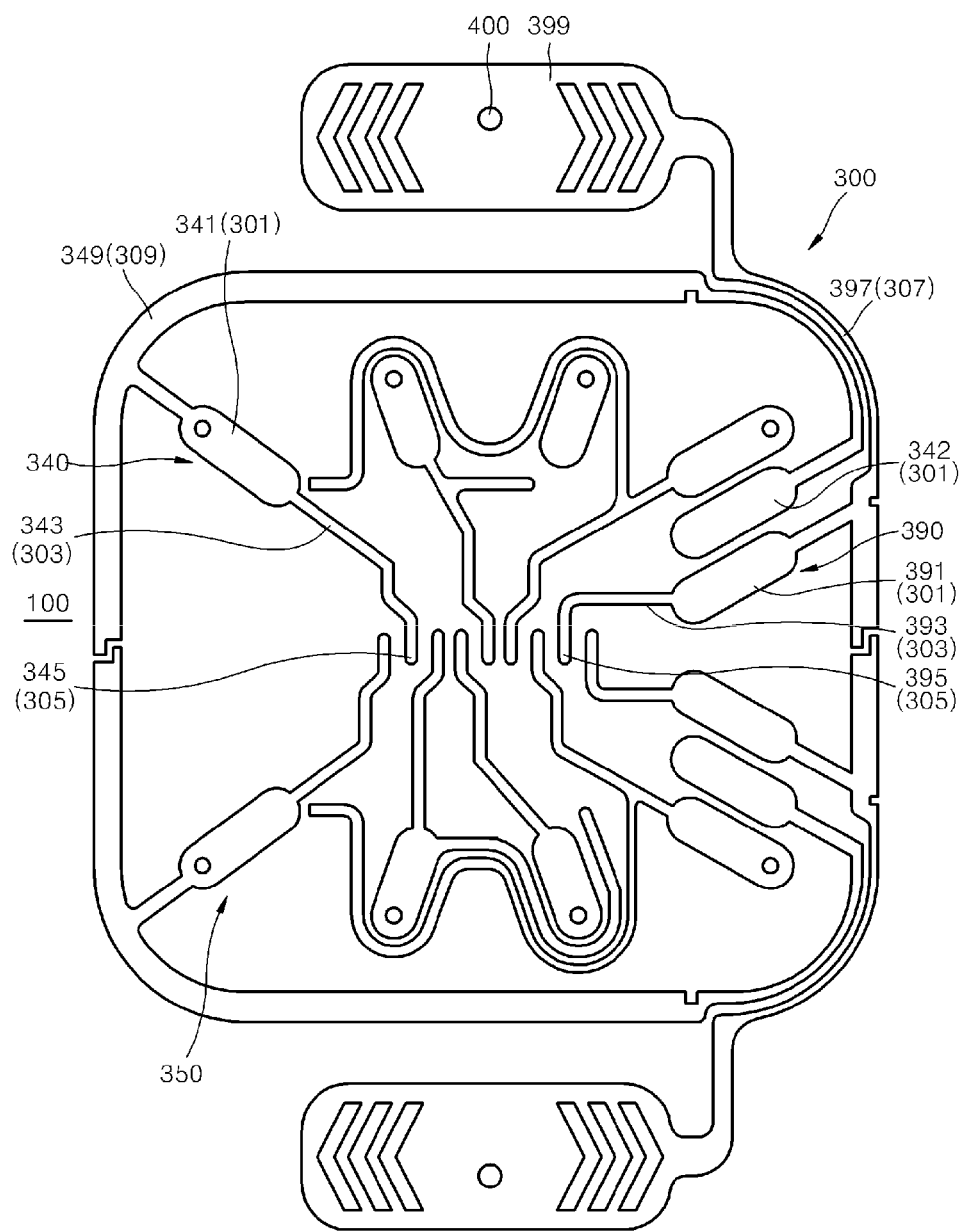
FIG. 4 is a plan view illustrating circuit patterns designed on a universal PCB having antenna connection pads according to an embodiment of the invention.

FIG. 4 is a plan view illustrating circuit patterns that are designed on a universal PCB having antenna connection pads according to an embodiment of the invention.

Referring to FIG. 4, an internal circuit pattern 300 on the PCB 100 (FIG. 1A) may include an internal antenna pattern 349 and/or the external antenna pads 399 to be connected to the external antenna. The internal circuit pattern 300 will now be described in detail, focusing on its structure for connection with the antenna.

In the internal circuit pattern 300, some of the internal connection pads 301, 303 and 305 and the internal connection lines 307 can be used to electrically connect the chip pad 511 or 550 and the linear internal antenna pattern 349 formed to surround the periphery of a region in which the internal connection pads 301, 303 and 305 are disposed. That is, a fourth internal connection pad group 340 may be used for connection with the internal antenna pattern 349.

Accordingly, the fourth inner antenna connection pad group 340 may include a first internal connection pad 341 for first wire bonding, a second pad 343 for flip-chip bonding connected to the first internal connection pad 341 by the internal connection line 307, and a third pad 345 for center pad bonding.

The fourth antenna connection pad group 340 may further include a first internal connection pad 342 that is disposed at a horizontally-opposite position of the first internal connection pad 341 and is connected to the other portion of the internal antenna pattern 349. Accordingly, when the IC chip 500 is wire-bonded on the PCB 100, an antenna signal line L1 (or L2) can be wire-bonded to the left or right side of the IC chip 500. The first internal connection pad 341 can be electrically connected through the connection via 400 to the external circuit pattern 200.

In the internal circuit pattern 300, some of the internal connection pads 301, 303 and 305 and the internal connection lines 307 can be used to electrically connect the chip pad 511 or 550 to the external antenna pad 399. For example, a first internal connection pad 391 for wire bonding, a second pad 393 for flip-chip bonding, a third pad 395 for center pad bonding, and the internal connection line 397 that constitutes the ninth internal connection pad group 390 (FIG. 2C), can be used as an external antenna connection pad group 390 for connecting the chip pad 511 or 550 to the external antenna pad 399.

An antenna pad 399 connected to the external antenna connection pad group 390 can be electrically connected to the external contact pad 250 by the connection via 400. When the smart card module having the IC chip 500 and the PCB 100 is inserted into the cavity of the smart card body, the external antenna pad 399 can be contact-connected to the external antenna buried in the smart card body.

The external antenna pad 399 and the internal connection pad group 390 connected to the pad 399 are formed in a pair in a vertically-symmetrical structure as illustrated in FIG. 4.

As described above, the internal circuit pattern 300 of the PCB 100 includes the internal antenna pattern 349, the internal connection pad group 340 connected to the pattern 349, the external antenna pad 399, and the external antenna connection pad group 390 connected to the pad 399, thereby enabling the wireless data communication.

Various chips (such as the IC chips 500 and 501) with various structures can be mounted on the universal PCB 100 that is equipped with the internal circuit pattern 300 including the internal connection pad groups located at different positions as illustrated in FIGS. 2A through 2C.

FIGS. 5A through 5I are plan views illustrating various structures in which IC chips are mounted on the internal circuit pattern according some embodiments of the invention.

Figure 5A:
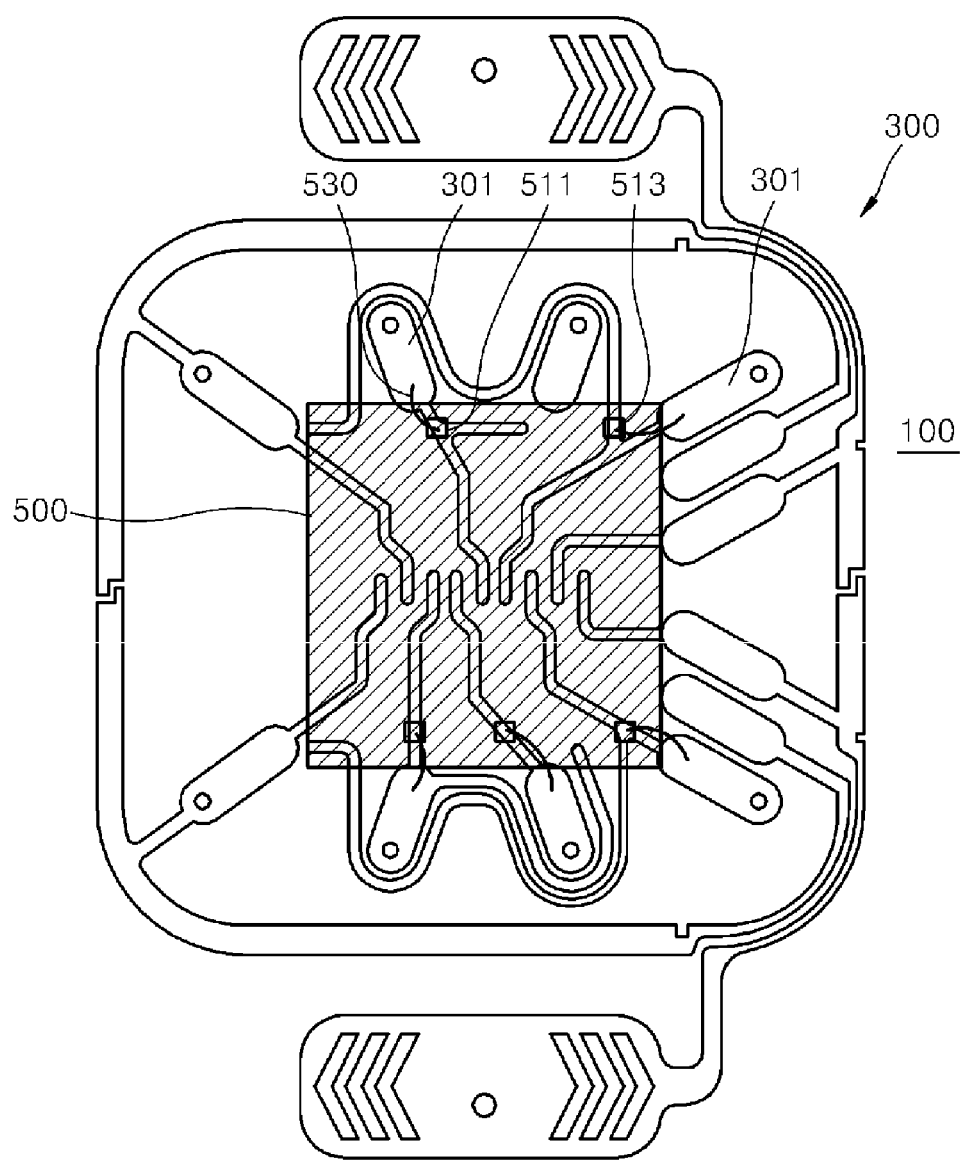
FIGS. 5A through 5I are plan views illustrating various structures in which IC chips are mounted on antenna connection pads according to an embodiment of the invention.

FIG. 5A illustrates a structure in which the edge-pad type IC chip 500 is wire-bonded to the internal circuit pattern 300 of the PCB 100. Referring to FIG. 5A, the chip pad 511 of the IC chip 500 can be electrically connected to a first internal connection pad 301 of the internal circuit pattern 300 by the bonding wire 530. The first internal connection pad 301 is designed such that it is exposed outside a region of the IC chip 500. A right chip pad 513 is bonded to the first internal connection pad 301 by the bonding wire 530.

Figure 5B:
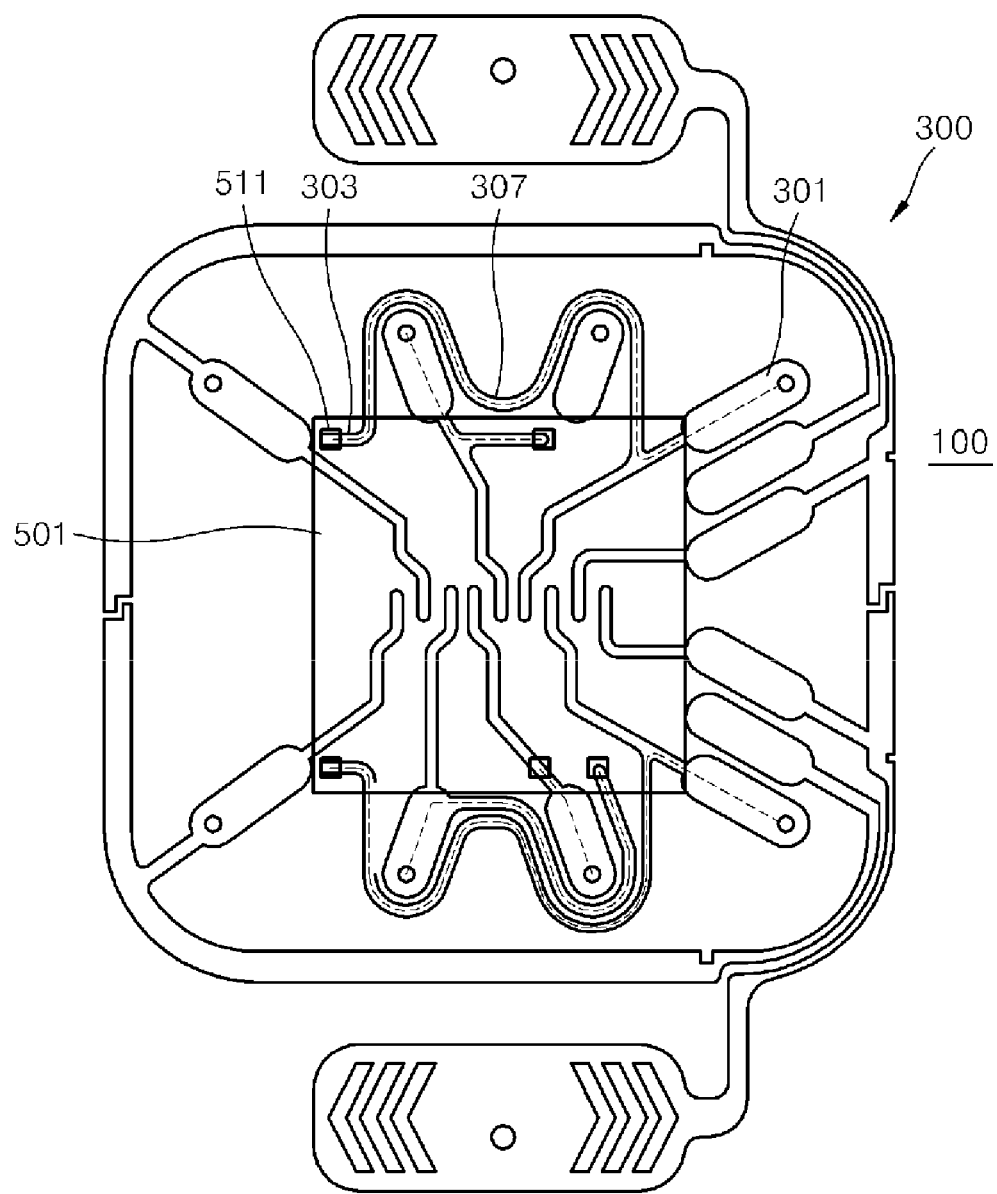

FIG. 5B illustrates a structure in which the IC chip 500 is flip-chip-bonded to the internal circuit pattern 300 of the PCB 100. Referring to FIG. 5B, the chip pad 513 or the bump of the IC chip 500 can be flip-chip-bonded to a second internal connection pad 303 of the internal circuit pattern 300. The second internal connection pad 303 is located corresponding to a left chip pad 511 but is electrically connected to the first internal connection pad 301 by the internal connection line 307 as indicated by a dotted line. This structure can be understood as being equivalent to the structure in which the right chip pad 513 is electrically connected to the internal connection pad 301 by the bonding wire 530 as illustrated in FIG. 5A.

Figure 5C:
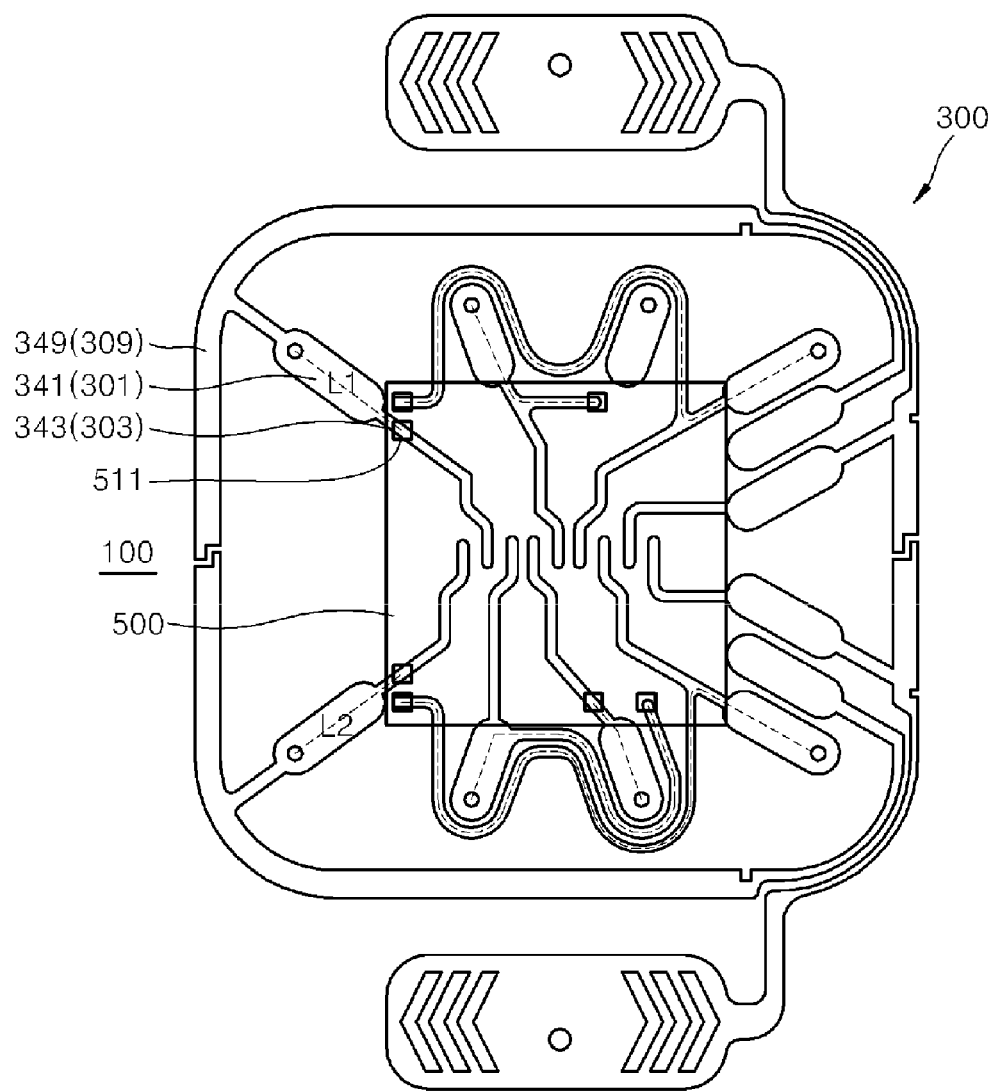

As illustrated in FIGS. 5A and 5B, the universal PCB 100 can be used for both the flip-chip bonding structure and the wire bonding structure. FIG. 5C illustrates a structure in which the IC chip 500 is flip-chip-bonded to the internal circuit pattern 300 of the PCB 100 and a connection to an antenna is formed to the left side.

Referring to FIG. 5C, a connection L1 (or L2) to the antenna is formed in such a way that the second internal connection pad 343, which is disposed at the left of the internal antenna connection pad group 340 and is connected to the internal antenna pattern 349, is flip-chip-bonded to the chip pad 511. The second internal connection pad 343 is connected to the internal connection pattern 349 through the first pad 341.

Figure 5D:
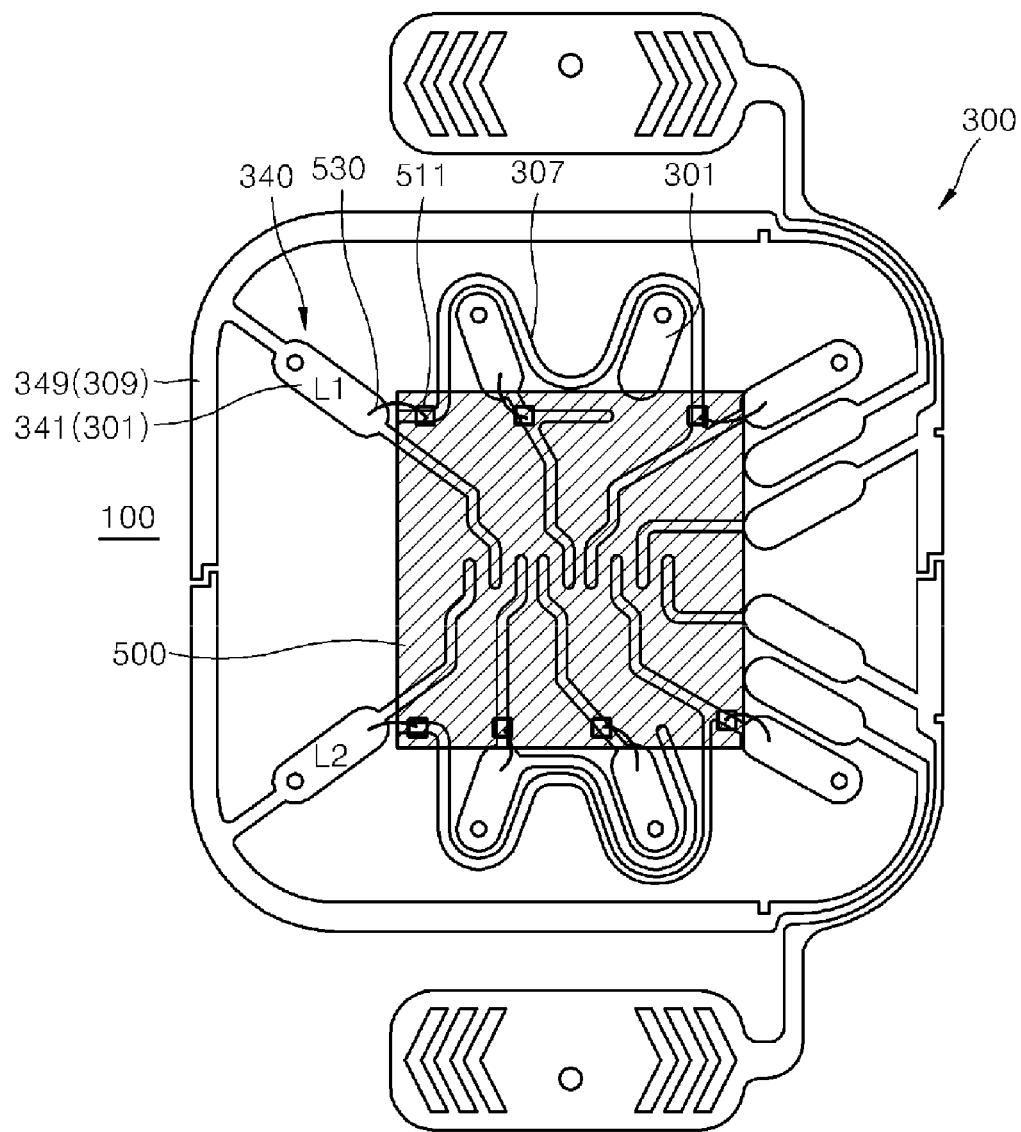

FIG. 5D illustrates a structure in which the IC chip 500 is wire-bonded to the internal circuit pattern 300 of the PCB 100. Referring to FIG. 5D, the chip pad 511 of the IC chip 500 can be electrically connected to the first internal connection pad 301 of the internal circuit pattern 300 by the bonding wire 530. The antenna connection L1 is formed in such a way that the first wire bonding internal connection pad 341, which is disposed at the left of the internal antenna connection pad group 340 and is connected to the internal antenna pattern 349, is connected to the chip pad 511 by the bonding wire 530. The antenna connection L2 is also formed to be vertically symmetrical with respect to the antenna connection L1.

Figure 5E:
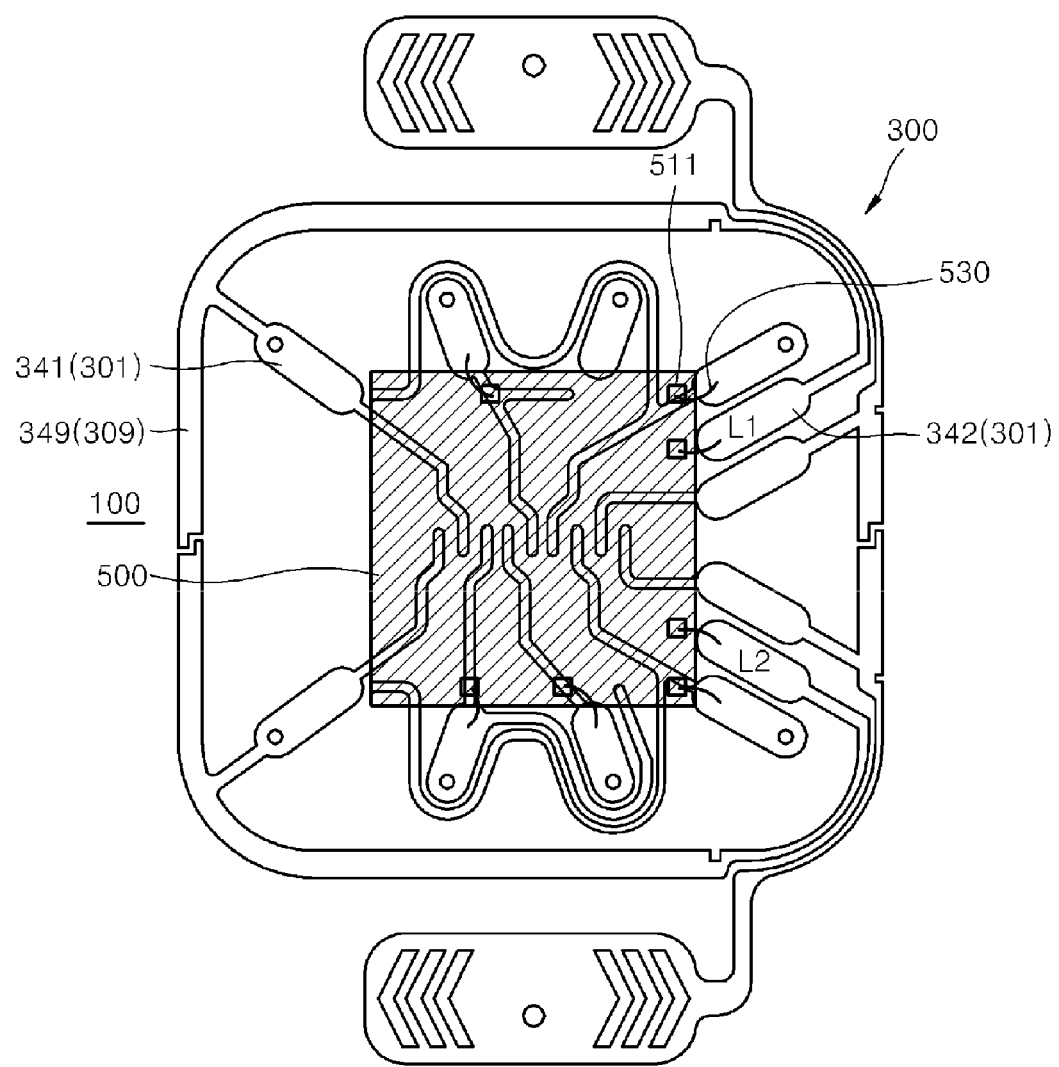

FIG. 5E illustrates a structure in which the IC chip 500 is wire-bonded to the internal circuit pattern 300 of the PCB 100. Referring to FIG. 5E, the antenna connection L1 is formed in such a way that the second wire bonding internal connection pad 342, which is disposed at the right of the internal antenna connection pad group 340 and is connected to the internal antenna pattern 349, is connected to the chip pad 511 by the bonding wire 530. The antenna connection L2 is also formed to be vertically symmetrical with respect to the antenna connection L1.

Figure 5F:
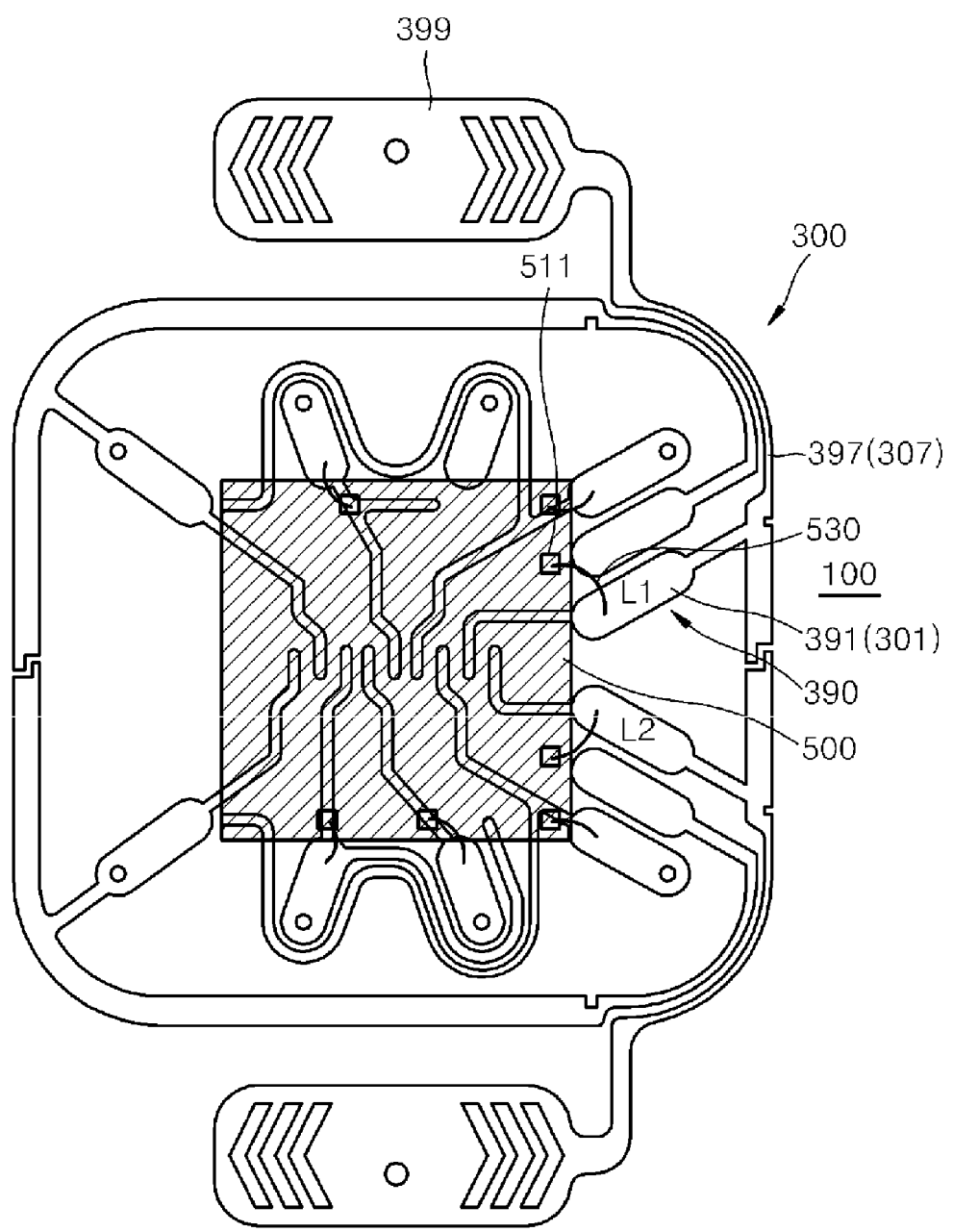

FIG. 5F illustrates a structure in which the IC chip 500 is wire-bonded to the internal circuit pattern 300 of the PCB 100 and the antenna connection L1 is formed to the right side of the IC chip 500. Referring to FIG. 5F, the antenna connection L1 is formed in such a way that the first internal connection pad 391 of the external antenna connection pad group 390, which is connected to the external antenna pad 399, is connected to the chip pad 511 by the bonding wire 530. The antenna connection L2 is also formed to be vertically symmetrical with respect to the antenna connection L1.

Figure 5G:
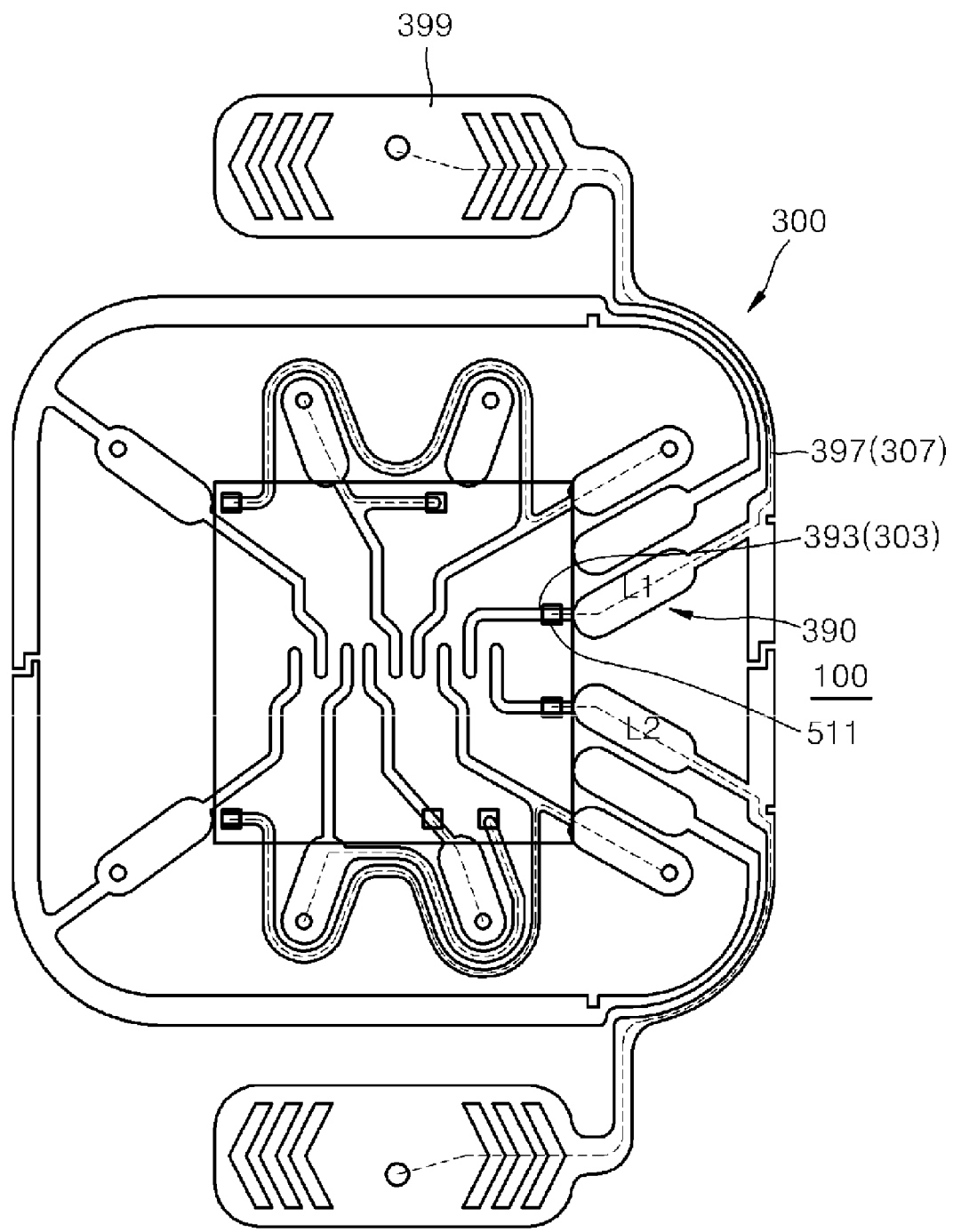

FIG. 5G illustrates a structure in which the IC chip 500 is flip-chip-bonded to the internal circuit pattern 300 of the PCB 100 and the antenna connection L1 is formed to the right side of the IC chip 500. Referring to FIG. 5G, the antenna connection L1 is formed in such a way that the second internal connection pad 393 of the external antenna connection pad group 390, which is connected to the external antenna pad 399, is flip-chip-bonded to the chip pad 511. The antenna connection L2 is also formed to be vertically symmetrical with respect to the antenna connection L1.

Figure 5H:
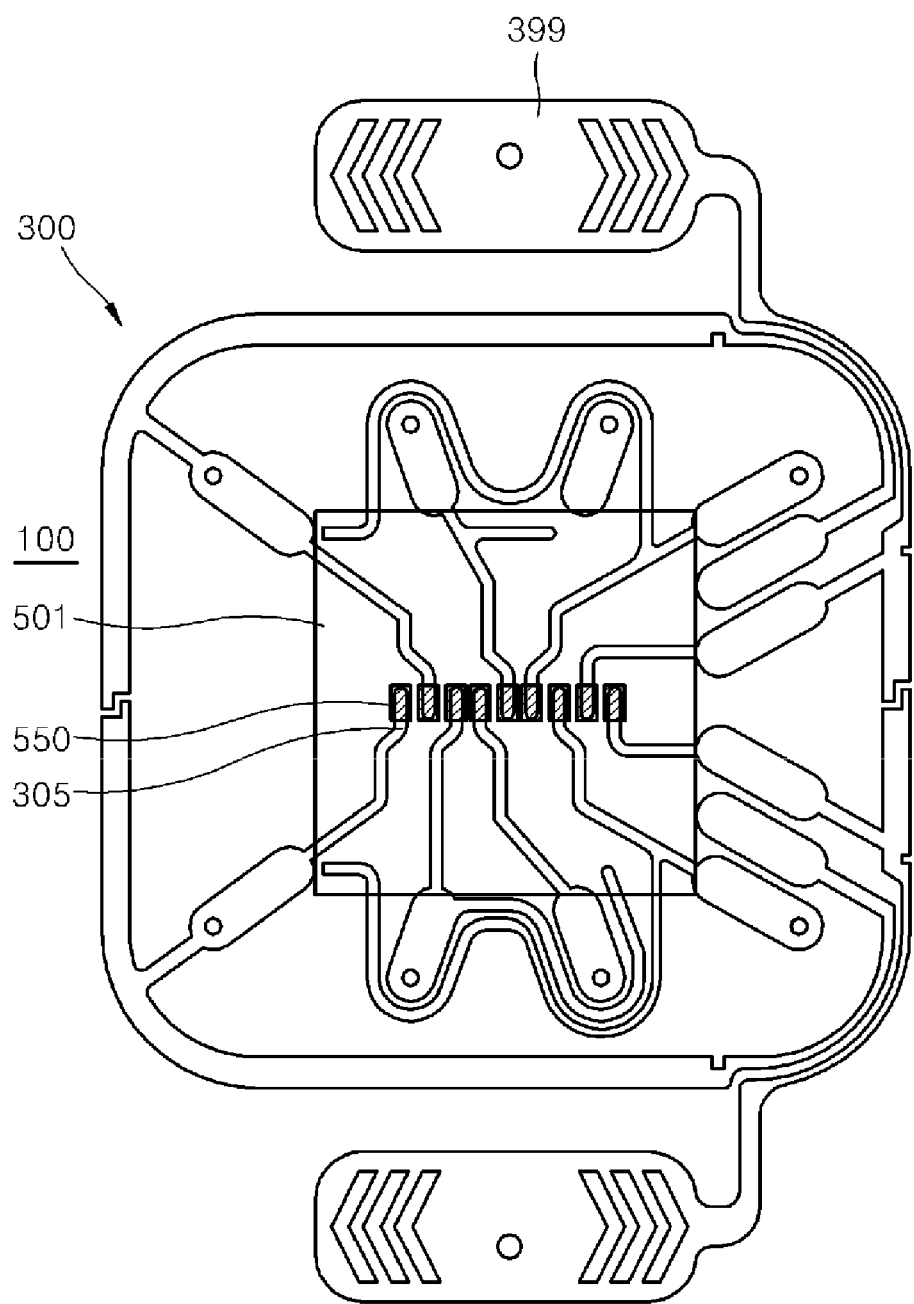

FIG. 5H illustrates a structure in which the center-pad type IC chip 501 is flip-chip-bonded to the internal circuit pattern 300 of the PCB 100. Referring to FIG. 5H, the chip pads 550 are respectively flip-chip-bonded to the third internal connection pads 305. At this point, all of the third internal connection pads 305 may be used.

Figure 5I:
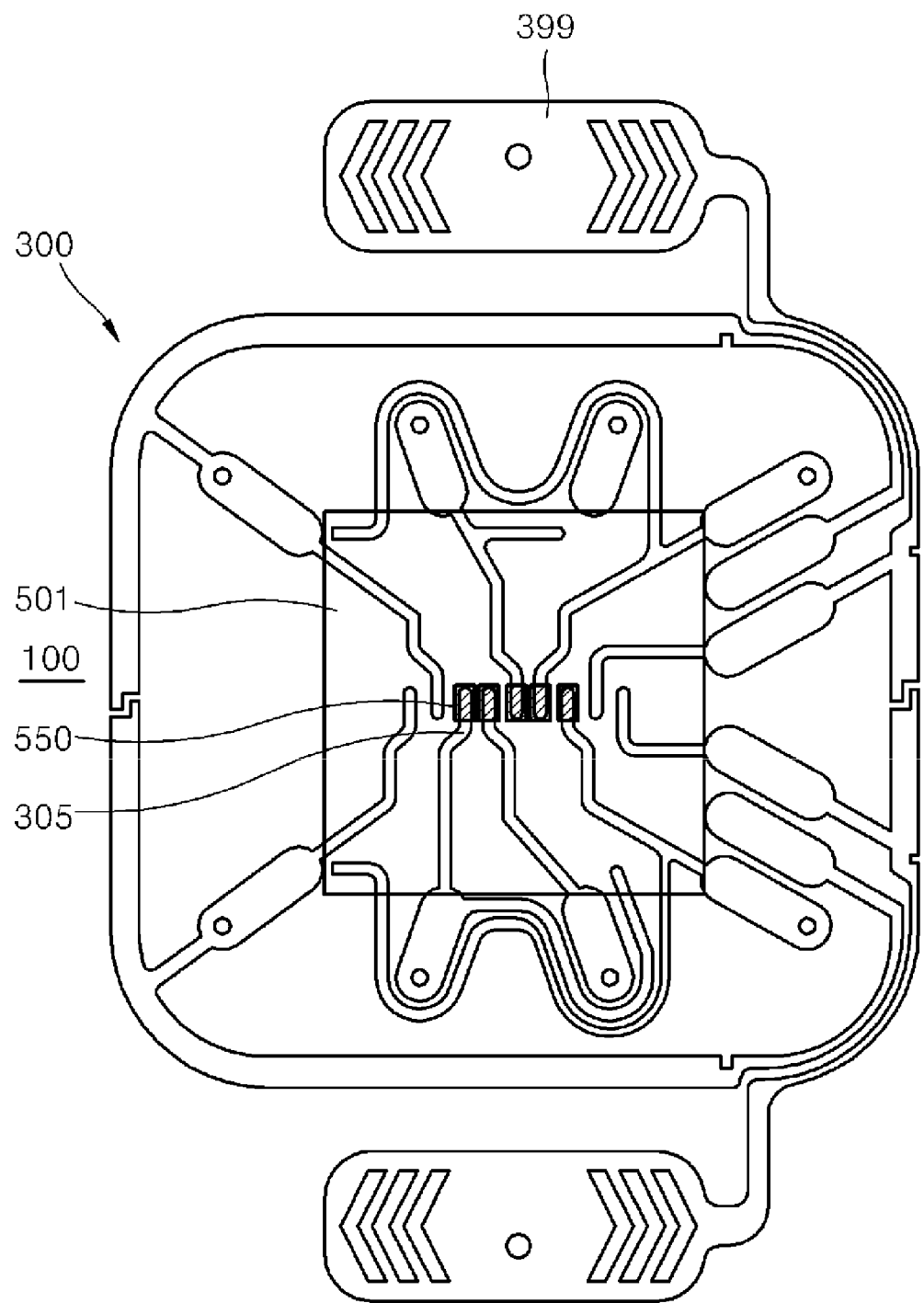

FIG. 5I illustrates a structure in which the center-pad type IC chip 501 is flip-chip-bonded to the internal circuit pattern 300 of the PCB 100. Referring to FIG. 5I, the chip pads 550 are respectively flip-chip-bonded to the third internal connection pads 305. At this point, only five of the eight third internal connection pads 350 are used. That is, FIG. 5I illustrates a case where the connection to the antenna is not used.

As illustrated in FIGS. 5A through 5I, the PCB 100 can be universally used regardless of the size, type and bonding structure of the IC chip.

Figure 6:
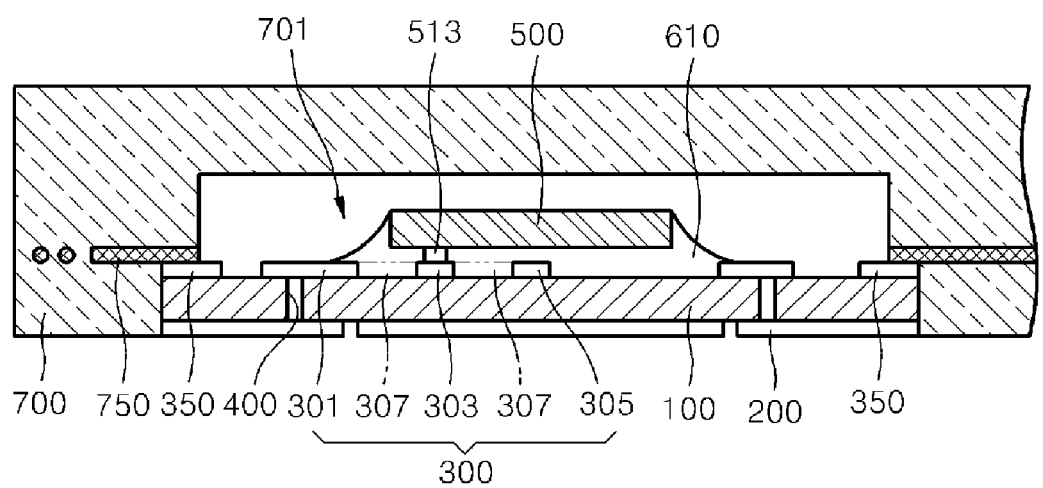
FIG. 6 is a sectional view of a smart card according to an embodiment of the invention.

FIG. 6 is a sectional view of a smart card according to some embodiments of the invention.

Referring to FIG. 6, a smart card is constructed in such a way that a smart card module is formed by mounting the IC chip 500 or 501 on the PCB 100 as illustrated in some of FIGS. 5A through 5I and is then inserted into a cavity 701 in a card body 700. At this point, the external antenna pad 399 can be contact-connected to an external antenna 750 buried in the card body 700. Although FIG. 6 illustrates a case where the flip-chip bonding is used to mount the IC chip 500 on the PCB 100, the wire bonding and the center pad bonding can also be used to form the smart card module as illustrated in FIGS. 1A and 1C.

As described above, the universal PCB according to the invention can be used suitably for the various positions of the chip pads, regardless of the size, type and bonding structure of the IC chip.

Also, since the internal circuit pattern connected to the IC chip of the PCB further includes the internal antenna patterns and/or the external antenna pads, and the internal connection pad groups intended to be electrically connected to the internal antenna patterns or the external antenna pads, the antenna can be selectively connected to the right or left side of the IC chip according to the type and bonding structure of the IC chip.

Accordingly, it is possible to produce various smart cards in bulk or mass, thereby reducing the manufacturing cost thereof.

The invention may be practiced in many ways. What follows are exemplary, non-limiting descriptions of some embodiments of the invention.

According to some embodiments of the invention, there is provided a smart card including: a card body having a cavity; an IC chip inserted into the cavity; and a PCB configured to mount the IC chip. The PCB may include: a board body having an inner surface configured to mount the IC chip and an outer surface opposite to the inner surface; an internal circuit pattern formed on the inner surface; an external connection pattern including external contact pads formed on the outer surface; and connection vias each penetrating the board body to connect one of the external contact pads and the internal circuit pattern.

The internal circuit pattern may include a plurality of internal connection pad groups each including: internal connection pads located at a plurality of different positions on the inner surface in such a way as to be electrically connected to chip pads of the IC chip regardless of a change in positions of the chip pads; and an internal connection line connecting the internal connection pads in a group.

The internal connection pads may be located outside a periphery of the IC chip to be wire-bonded to the chip pad when the IC chip is wire-bonded to the internal circuit pattern.

The internal connection pads may be located so as to be flip-chip-bonded to the chip pad when the IC chip is flip-chip-bonded to the internal circuit pattern.

The chip pad may be a center pad located at a center portion of the IC chip, and the internal connection pads may be located at a center portion of the internal circuit pattern in such a way as to correspond to the center pad.

The chip pad may be an edge pad located at an edge portion of the IC chip, and one of the internal connection pads may be located corresponding to an edge portion of the IC chip in such a way as to correspond to the edge pad.

The internal circuit pattern may further include a pair of linear symmetrical internal antenna patterns surrounding a region in which the internal connection pad groups are disposed, and one of the internal connection pad groups may further include another internal connection pad configured to electrically connect one of the chip pads and the internal antenna patterns.

One of the internal connection pad groups may include two internal connection pads formed respectively on left and right sides of the inner surface so as to wire-bond the internal antenna patterns and one of the chip pads.

The internal circuit pattern may further include a pair of vertically-symmetrical external antenna pads disposed outside a periphery of a region in which the internal connection pad groups are disposed, and one of the internal connection pad groups may further include: another internal connection pad configured to electrically connect one of the chip pads and the external antenna pads; and a connection line configured to connect the internal connection pad and the external antenna pads.

The smart card may further include an external antenna buried in the card body to contact with the external antenna pads.

The external circuit pattern may further include a pair of external antenna pads symmetrically formed outside the external contact pads, and one of the internal connection pads may be electrically connected to the external antenna pads by a connection via connecting the external antenna pads and the internal contact pads.

The external circuit pattern may include eight external contact pads defined in the ISO 7816-2 standard, and the internal circuit pattern may include a plurality of the internal connection pad groups disposed corresponding to at least the eight external contact pads.

The edge-pad type IC chip is advantageous in that it can be connected by wire bonding. The center-pad type IC chip is advantageous in that it can be relatively reduced in size. The reason for this is that the widest pattern, that is, a power pattern and a ground pattern must be disposed at all four sides of the edge-pad type IC chip, but is disposed at only a center portion of the center-pad type IC chip. However, the center-pad type IC chip is disadvantageous in that it requires dedicated assembly equipment. The invention is suitable for both types of IC chips and thus is capable of utilizing the advantages of either or both types.

Accordingly, the universal PCB can be used suitably for the various positions of the chip pads, regardless of the size, type and bonding structure of the IC chip. Consequently, it is possible to produce various smart cards in bulk or mass, thereby reducing the manufacturing cost thereof.

While the invention has been particularly shown and described with reference to exemplary embodiments thereof, it will be understood by those of ordinary skill in the art that various changes in form and details may be made therein without departing from the spirit and scope of the invention as defined by the following claims.

The invention claimed is:

1. A smart card comprising:
   a card body having a cavity; and
   a PCB module disposed within the cavity, the PCB module including a PCB and an IC chip flip-chip-bonded to the PCB,
   the PCB including:
   a board body having an inner surface to which the IC chip is mounted and an outer surface opposite to the inner surface,
   an internal circuit pattern on the inner surface, the internal circuit pattern comprising a plurality of internal connection pad groups each constituted by a plurality of internal connection pads and a respective internal connection line connecting the internal connection pads wherein the internal connection pads of each group are located at different relative positions on the inner surface of the board body,
   an external circuit pattern on the outer surface, the external circuit pattern comprising external contact pads, and
   connection vias extending through the board body, the connection vias electrically connecting the external contact pads with the internal connection pad groups, and the PCB and the IC chip having corresponding internal and center pads wherein the IC chip has at least one center pad located at a central portion of the IC chip, and one of the internal connection pads of each of at least one of the internal connection pad groups is located at a central portion of the of the PCB and faces and is bonded to the corresponding center pad of the IC chip.

2. The smart card of claim 1, wherein another of the internal connection pads of said one of the groups of connection pads lies on said inner surface of the board body outside the periphery of the IC chip.

3. The smart card of claim 1, wherein the corresponding internal connection and center pads of the PCB and the IC chip are constituted by a plurality of internal connection pads of the PCB aligned along a central portion of the PCB and a plurality of center pads of the IC chip aligned along a central portion of the chip.

4. The smart card of claim 1, wherein the external circuit pattern comprises eight external contact pads conforming to the ISO 7816-2 standard, and the plurality of internal connection pad groups of the internal circuit pattern comprises eight internal connection pad groups corresponding to and respectively connected by the connection vias to the eight external contact pads.

5. A smart card comprising:
   a card body having a cavity; and
   a PCB module disposed within the cavity, the PCB module including a PCB and an IC chip flip-chip-bonded to the PCB,
   the IC chip including a plurality of chip pads, and
   the PCB including:
   a board body having an inner surface to which the IC chip is mounted and an outer surface opposite to the inner surface,
   an internal circuit pattern on the inner surface, the internal circuit pattern comprising a plurality of internal connection pad groups each constituted by a plurality of internal connection pads and a respective internal connection line connecting the internal connection pads wherein the internal connection pads of each group are located at different relative positions on the inner surface of the board body,
   an external circuit pattern on the outer surface, the external circuit pattern comprising external contact pads, and
   connection vias extending through the board body, the connection vias electrically connecting the external contact pads with the internal connection pad groups, and
   wherein the internal circuit pattern further comprises a pair of linear internal antenna patterns surrounding and disposed symmetrically with respect to a region in which the internal connection pad groups are disposed, and one of the internal connection pad groups further comprises an internal antenna connection pad electrically connecting one of the chip pads and one of the internal antenna patterns.

6. The smart card of claim 5, wherein said one of the internal connection pad groups comprises two internal antenna connection pads disposed on opposite sides of the inner surface, each of the two antenna connection pads connected to said one of the internal antenna patterns and lying at least in part radially outwardly of the IC chip on said inner surface of the board body, and only one of the two antenna connection pads being wire-bonded to the IC chip.

7. The smart card of claim 5, wherein the external circuit pattern comprises eight external contact pads conforming to the ISO 7816-2 standard, and the plurality of internal connection pad groups of the internal circuit pattern comprises eight internal connection pad groups corresponding to and respectively connected by the connection vias to the eight external contact pads.

8. A smart card comprising:
a card body having a cavity; and
a PCB module disposed within the cavity, the PCB module including a PCB and an IC chip flip-chip-bonded to the PCB,
the IC chip including a plurality of chip pads, and
the PCB including:
a board body having an inner surface to which the IC chip is mounted and an outer surface opposite to the inner surface, and
an internal circuit pattern on the inner surface, the internal circuit pattern comprising a plurality of internal connection pad groups each constituted by a plurality of internal connection pads and a respective internal connection line connecting the internal connection pads wherein the internal connection pads of each group are located at different relative positions on the inner surface of the board body,
an external circuit pattern on the outer surface, the external circuit pattern comprising external contact pads, and
connection vias extending through the board body, the connection vias electrically connecting the external contact pads with the groups of the internal connection pad groups, and
wherein the internal circuit pattern further comprises a pair of external antenna pads disposed outside and symmetrically with respect to a region in which the internal connection pad groups pads are disposed, and
at least one of the internal connection pad groups comprises: an internal antenna connection pad electrically connected to a respective one of the chip pads, and a connection line connecting the internal antenna connection pad and a respective one of the external antenna pads.

9. The smart card of claim 8, further comprising an external antenna buried in the card body and disposed in contact with the external antenna pads.

10. The smart card of claim 8, wherein the external circuit pattern further comprises a pair of external antenna contact pads disposed outside of and symmetrically with respect to a region in which the external contact pads are disposed, and the connection vias also electrically connect the external antenna pads and the external antenna contact pads.

11. The smart card of claim 8, wherein the external circuit pattern comprises eight external contact pads conforming to the ISO 7816-2 standard, and the plurality of internal connection pad groups of the internal circuit pattern comprises eight internal connection pad groups corresponding to and respectively connected by the connection vias to the eight external contact pads.

12. A smart card comprising:
a card body having a cavity; and
a PCB module disposed within the cavity, the PCB module including a PCB and an IC chip mounted to the PCB,
the IC chip including a plurality of chip pads, and
the PCB including:
a board body having an inner surface to which the IC chip is mounted and an outer surface opposite to the inner surface,
an internal circuit pattern on the inner surface, the internal circuit pattern comprising a plurality of internal connection pad groups each constituted by a plurality of internal connection pads and a respective internal connection line connecting the internal connection pads wherein the internal connection pads of each group are located at different relative positions on the inner surface of the board body,
an external circuit pattern on the outer surface, the external circuit pattern comprising external contact pads, and
connection vias extending through the board body, the connection vias electrically connecting the external contact pads with the internal connection pad groups, and
wherein the connection line of at least one of the internal connection pad groups has two branches, one of the two internal connection pads is disposed under the IC chip along one of the branches, the other of the two internal connection pads lies outside the periphery of the IC chip along the other of the branches, the IC chip is wire bonded or flip-chip-bonded to the PCB with one of the chip pads of the IC chip being bonded to one of said two internal connection pads connected by the branched connection line, and said two of the connection pads connected by the branched connection line are disposed approximately symmetrically with respect to a chip mounting region of the PCB such that one of the chip pads is disposed directly over said one of the two internal connection pads when the IC chip is disposed in the chip mounting region with the chip pads facing the internal surface of the body of the PCB and such that said one of the chip pads is disposed adjacent said other of the two connection pads when the IC chip is disposed in the chip mounting region with the chip pads facing away from the internal surface of the body.

13. The smart card of claim 12, wherein a plurality of the internal connection pad groups each include an internal connection pad at a central portion of the chip mounting region of the PCB.

14. The smart card of claim 12, wherein the external circuit pattern comprises eight external contact pads conforming to the ISO 7816-2 standard, and the plurality of internal connection pad groups of the internal circuit pattern comprises eight internal connection pad groups corresponding to and respectively connected by the connection vias to the eight external contact pads.

* * * * *